(12) United States Patent
Lee

(10) Patent No.: US 7,897,981 B2
(45) Date of Patent: Mar. 1, 2011

(54) LIGHT EMITTING DEVICE AND METHOD OF MANUFACTURING THE SAME

(75) Inventor: Jae Ho Lee, Ansan-si (KR)

(73) Assignee: Seoul Opto Device Co., Ltd., Ansan-si (KR)

( * ) Notice: Subject to any disclaimer, the term of this patent is extended or adjusted under 35 U.S.C. 154(b) by 545 days.

(21) Appl. No.: 11/997,550

(22) PCT Filed: Aug. 7, 2006

(86) PCT No.: PCT/KR2006/003095

§ 371 (c)(1),
(2), (4) Date: Jan. 31, 2008

(87) PCT Pub. No.: WO2007/018390

PCT Pub. Date: Feb. 15, 2007

(65) Prior Publication Data

US 2008/0191632 A1   Aug. 14, 2008

(30) Foreign Application Priority Data

Aug. 10, 2005   (KR) .................... 10-2005-0073284

(51) Int. Cl.
*H01L 29/18* (2006.01)

(52) U.S. Cl. .............. 257/88; 257/22; 257/99; 257/778; 257/E33.068; 438/22; 438/34; 438/108; 438/109; 438/118; 135/185 R; 135/272; 135/312

(58) Field of Classification Search ............ 257/82, 257/88, 98, 99, 103, 984, 778, 779, E33.068, 257/E33.066; 438/22, 26, 33, 34, 108–111, 438/118, 119; 315/185 R, 272, 200 R, 312; 362/227, 800; 363/88, 108, 126

See application file for complete search history.

(56) References Cited

U.S. PATENT DOCUMENTS 6,433,370 B1 * 8/2002 Metzler .................... 257/263

(Continued)

FOREIGN PATENT DOCUMENTS

JP   05-198843   8/1993

(Continued)

*Primary Examiner*—Haissa Philogene
(74) *Attorney, Agent, or Firm*—H.C. Park & Associates, PLC

(57) ABSTRACT

The present invention provides a light emitting device comprising a first semiconductor substrate including a light emitting cell block having a plurality of light emitting cells connected in series on one surface thereof; a second semiconductor substrate having one surface formed with a rectifying bridge and the other surface bonded to the other surface of the first semiconductor substrate; and a submount substrate to which the second semiconductor substrate is flip-chip bonded to be in contact with the one surface of the second semiconductor substrate, wherein rectified power is applied to the light emitting cell block through the rectifying bridge. The present invention further provides a method of manufacturing the light emitting device. The light emitting device and the method of manufacturing the same according to the present invention have advantages in that a flicker effect generated from an AC power source can be minimized and constant brightness can be maintained even in changes in the voltage of the AC power source by integrating a rectifying circuit into a light emitting device with a flip-chip structure, and in that there is no cumbersomeness of mounting an additional auxiliary device, resulting in increase of the degree of utilization of space and improved light output.

12 Claims, 6 Drawing Sheets

U.S. PATENT DOCUMENTS

| | | | |
|---|---|---|---|
| 6,577,072 B2 * | 6/2003 | Saito et al. | 315/185 R |
| 7,723,736 B2 * | 5/2010 | Lee et al. | 257/88 |
| 7,723,737 B2 * | 5/2010 | Lee et al. | 257/88 |
| 7,768,020 B2 * | 8/2010 | Kim et al. | 257/88 |
| 2002/0158590 A1 | 10/2002 | Saito et al. | |
| 2008/0210954 A1 * | 9/2008 | Lee et al. | 257/88 |
| 2008/0217628 A1 * | 9/2008 | Lee et al. | 257/88 |

FOREIGN PATENT DOCUMENTS

| | | |
|---|---|---|
| JP | 11-307815 | 11/1999 |
| JP | 2004-093657 | 3/2004 |
| KR | 1020010093337 | 10/2001 |
| KR | 1020060001800 | 1/2006 |
| KR | 1020060037589 | 5/2006 |

* cited by examiner

LIGHT EMITTING DEVICE AND METHOD OF MANUFACTURING THE SAME

RELATED APPLICATIONS

This application is a U.S. national phase application of PCT International Application No. PCT/KR2006/003095, filed Aug. 7, 2006, which claims priority of Korean Patent Application No. 2005-073284, filed Aug. 10, 2005, the contents of which are incorporated herein by reference in their entirety.

FIELD OF THE INVENTION

The present invention relates to a light emitting device and a method of manufacturing the same, and more particularly, to a light emitting device with a flip-chip structure, which can improve the degree of integration of elements and reduce a flicker effect due to an alternating current (AC) in the light emitting device, and a method of manufacturing the light emitting device.

BACKGROUND OF THE INVENTION

A light emitting diode (LED) refers to an element in which minority carriers (electrons or holes) injected using a p-n junction structure of a semiconductor are produced and certain light is emitted through recombination thereof. Light emitting sources are formed through changes in a compound semiconductor material such as GaAs, AlGaAs, GaN, InGaN or AlGaInP so that a variety of colors can be implemented.

The light emitting diodes exhibit properties of less power consumption and longer life span as compared with existing bulbs or fluorescent lamps and can be installed in a narrow space and strongly resist vibration. Such light emitting diodes have been used as display devices and backlights, and studies on application of the light emitting diodes to general illumination have been actively conducted since they are excellent in view of less power consumption and durability. It is expected that their applications will be expanded to large-sized LCD-TV backlights, headlights for vehicles, and general illumination. To this end, it is necessary to improve the luminous efficiency of a light emitting diode, to solve problem of heat dissipation, and to achieve high luminance and high output.

To solve these problems, gradually increasing attention is recently paid to a flip-chip type light emitting device.

FIG. 1 is a sectional view showing a conventional light emitting device with a flip-chip structure.

Referring to FIG. 1, light emitting layers, i.e., an N-type semiconductor layer 5, an active layer 6 and a P-type semiconductor layer 7 are sequentially formed on a predetermined substrate 1. The P-type semiconductor layer 7 and the active layer 6 are partially etched to expose the N-type semiconductor layer 5, thereby fabricating a light emitting cell. Further, an additional submount substrate 2 is prepared and first and second electrodes 3 and 4 are formed thereon, and P-type and N-type solders 8 and 9 are formed on the first and second electrodes 3 and 4, respectively. Thereafter, the light emitting cell is bonded to the submount substrate 2, and a P-electrode and an N-electrode of the light emitting cell are bonded to the P-type and N-type solders 8 and 9, respectively. A molding member (not shown) is formed to encapsulate the substrate with the light emitting cell bonded thereto, thereby manufacturing a light emitting device.

Since the conventional light emitting device with such a flip-chip structure has a higher heat dissipation efficiency as compared with an existing light emitting device and hardly shields light, there is an advantage in that light efficiency is increased by 50% or more as compared with the existing light emitting device. Further, since a gold wire for use in driving a light emitting device is not required, many applications thereof to various small-sized packages have been considered.

However, when the aforementioned light emitting device with a flip-chip structure is driven under a household AC power source, a flicker effect occurs according to on/off at 50 to 60 Hz in the AC power source. Thus, there is cumbersomeness in that an additional auxiliary circuit should be mounted. Accordingly, there is a disadvantage in that manufacturing costs rise due to increases in processing time and costs.

SUMMARY OF THE INVENTION

The present invention is conceived to solve the aforementioned problems. Accordingly, an object of the present invention is to provide a light emitting device with a flip-chip structure, wherein a rectifying circuit is integrated into the light emitting device so that a flicker effect generated due to an AC power source can be minimized, the degree of utilization of space can be increased and light output can be enhanced, and a method of manufacturing the light emitting device.

To achieve the object, the present invention provides a light emitting device comprising a first semiconductor substrate including a light emitting cell block having a plurality of light emitting cells connected in series on one surface thereof; a second semiconductor substrate having one surface formed with a rectifying bridge and the other surface bonded to the other surface of the first semiconductor substrate; and a submount substrate to which the second semiconductor substrate is flip-chip bonded to be in contact with the one surface of the second semiconductor substrate, wherein rectified power is applied to the light emitting cell block through the rectifying bridge.

The rectifying bridge may comprise a first diode block connected between first and second nodes; a second diode block connected between the first node and a fourth node; a third diode block connected between the second node and a third node; and a fourth diode block connected between the third and fourth nodes. At this time, the light emitting cell block may be connected between the second and fourth nodes, and a power source may be connected between the first and third nodes.

The submount substrate may comprise first and second connection pads and first and second power supply pads, which are formed to be spaced apart form one another. The first power supply pad may be connected between the first and second diode blocks, the second power supply pad may be connected between the third and fourth diode blocks, the first connection pad may be connected between the first and third diode blocks, the second connection pad may be connected between the second and fourth diode blocks, and both ends of the light emitting cell block may be respectively connected to the first and second connection pads.

Each of the plurality of light emitting cells of the light emitting cell block may comprise N-type and P-type semiconductor layers. The N-type and P-type semiconductor layers of adjacent light emitting cells may be electrically connected, an N-type bonding pad may be formed on the N-type semiconductor layer of the light emitting cell at one end of the light emitting cell block, and a P-type bonding pad may be formed on the P-type semiconductor layer of the light emitting cell at the other end of the light emitting cell block.

Uneven portion may be formed on at least one surface of the first or second semiconductor substrate.

The present invention provides a method of manufacturing a light emitting device, comprising the steps of providing a first semiconductor substrate by forming a light emitting cell block having a plurality of light emitting cells connected in series on one surface of a first substrate; providing a second semiconductor substrate by forming a rectifying bridge on one surface of a second substrate; bonding the first and second substrates such that the other surfaces of the first and second substrates are in contact with each other; and bonding the second substrate to a submount substrate such that the rectifying bridge of the second semiconductor substrate is connected thereto, and connecting the light emitting cell block to the rectifying bridge.

The step of providing the first semiconductor substrate may comprise the steps of sequentially forming N-type and P-type semiconductor layers on the one surface of the first substrate; partially removing the N-type and P-type semiconductor layers to form a plurality of light emitting cells; and connecting the N-type semiconductor layer of one light emitting cell to the P-type semiconductor of another light emitting cell adjacent thereto through a bridge wire.

The step of providing the second semiconductor substrate may comprise the step of forming four diode blocks each of which has one or more light emitting cells on the one surface of the second substrate. The step of forming the diode blocks may comprise the steps of forming a plurality of light emitting cells on the one surface of the second substrate; connecting the N-type semiconductor layer of one light emitting cell and the P-type semiconductor of another light emitting cell adjacent thereto through a bridge wire; and forming an N-type bonding pad on the N-type semiconductor layer of the light emitting cell at one end of the diode block, and forming a P-type bonding pad on the P-type semiconductor layer of the light emitting cell at the other end of the diode block.

The bridge wire may connect the N-type semiconductor layer of one light emitting cell to the P-type semiconductor layer of the other light emitting cell adjacent thereto through a bridge process or a step coverage process.

The method may further comprise the step of forming uneven portion on the one surface of the first substrate before the step of providing the first semiconductor substrate.

DESCRIPTION OF THE DRAWINGS

The above and other objects, features and advantages of the present invention will become apparent from the following description of preferred embodiments given in conjunction with the accompanying drawings, in which.

DETAILED DESCRIPTION

Figure 1:
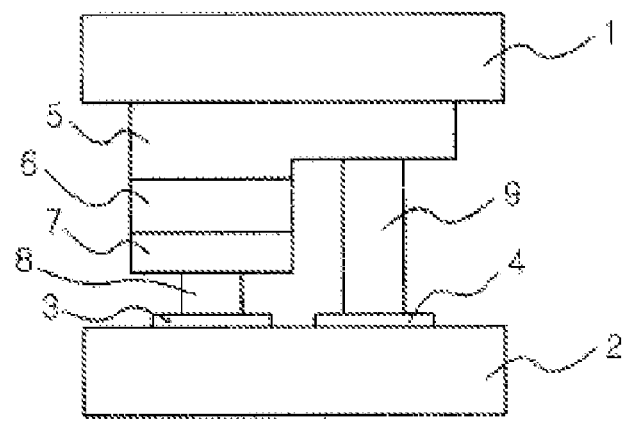
FIG. 1 is a sectional view showing a conventional light emitting device with a flip-chip structure.

Hereinafter, preferred embodiments of the present invention will be described in detail with reference to the accompanying drawings. However, the present invention is not limited to the embodiments but may be implemented into different forms. These embodiments are provided only for illustrative purposes and for full understanding of the scope of the present invention by those skilled in the art. Throughout the drawings, like elements are designated by like reference numerals.

Figure 2:
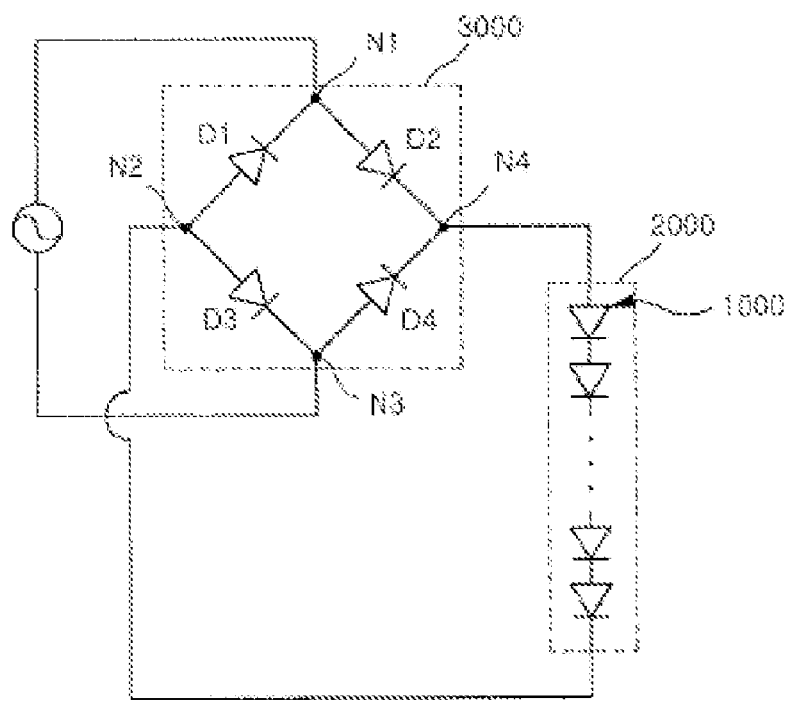
FIG. 2 is a conceptual circuit diagram illustrating a light emitting device according to the present invention.

FIG. 2 is a conceptual circuit diagram illustrating a light emitting device according to the present invention.

Referring to this figure, the light emitting device comprises a light emitting cell block 2000 having a plurality of light emitting cells 1000 connected in series, and a rectifying bridge 3000 for applying a predetermined current to the light emitting cell block 2000. In this embodiment, the light emitting cell block 2000 having the plurality of light emitting cells 1000 connected in series is electrically connected to an external power source not directly but through the rectifying bridge 3000.

More specifically, the rectifying bridge 3000 comprises a first diode D1 connected between first and second nodes N1 and N2; a third diode D3 connected between the second node N2 and a third node N3; a fourth diode D4 connected between the third node N3 and a fourth node N4; and a second diode D2 connected between the first and fourth nodes N1 and N4.

Here, the first and third nodes N1 and N3 are connected to an AC power source.

Further, the light emitting cell block 2000 is connected between the second and fourth nodes N2 and N4 of the rectifying bridge 3000.

The driving of the light emitting device of the present invention will be described with reference to this figure. If a positive voltage (+) is applied to the first node N1 and a negative voltage (−) is applied to the third node N3 when the light emitting device is driven by the AC power source, a current flows through the first node N1, the second diode D2, the light emitting cell block 2000, the third diode D3 and the third node N3 so that the light emitting cell block 2000 can emit light. On the contrary, if a positive voltage (+) is applied to the third node N3 and a negative voltage (−) is applied to the first node N1, a current flows through the third node N3, the fourth diode D4, the light emitting cell block 2000, the first diode D1 and the first node N1 so that the light emitting cell block 2000 can emit light. As such, the light emitting cell block 2000 emits light by means of the rectifying bridge 3000 regardless of the phase of AC power applied from the outside.

In the light emitting device of the present invention, these rectifying bridge 3000 and light emitting cell block 2000 are formed in a single light emitting device, thereby minimizing a flicker effect due to the AC power source and enhancing the degree of integration of elements. Moreover, it is intended to obtain an advantage of reduced thermal load on a light emitting device by applying a flip-chip structure thereto to increase light efficiency and improve heat dissipation. A detailed description thereof will be given later.

Figure 3:
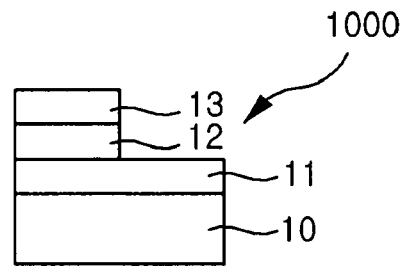
FIG. 3 is a sectional view of a unit light emitting cell according to the present invention.

FIG. 3 is a sectional view of a unit light emitting cell according to the present invention.

Referring to this figure, the light emitting cell 1000 comprises a substrate 10, and an N-type semiconductor layer 11, an active layer 12 and a P-type semiconductor layer 13 sequentially laminated on the substrate 10.

The substrate 10 refers to a general wafer for use in fabricating a light emitting device, and a transparent substrate made of sapphire is used in this embodiment.

The light emitting cell may further comprise a buffer layer (not shown) for reducing lattice mismatch between the substrate 10 and the subsequent layers upon growth of crystals on the substrate 10. The buffer layer may contain GaN or AlN that is a semiconductor material.

The N-type semiconductor layer 11 is a layer in which electrons are produced, and formed of an N-type compound semiconductor layer and an N-type clad layer. At this time, the N-type compound semiconductor layer is made of GaN doped with N-type impurities. The P-type semiconductor layer 13 is a layer in which holes are produced, and formed of a P-type clad layer and a P-type compound semiconductor layer. At this time, the P-type compound semiconductor layer is made of AlGaN doped with P-type impurities.

The active layer 12 is a region in which a predetermined band gap and a quantum well are formed so that electrons and holes can be recombined. The active layer contains InGaN. Further, the wavelength of light generated by the combination of electrons and holes, varies depending on the kind of a material constituting the active layer 12. Therefore, it is preferred that a semiconductor material contained in the active layer 12 be controlled depending on a target wavelength.

Further, the light emitting cell 1000 may further comprise an N-type bonding pad (see 50 in FIG. 5) formed on the N-type semiconductor layer 11, and a P-type bonding pad (see 55 in FIG. 5) formed on the P-type semiconductor layer 13.

At this time, an N-type ohmic contact layer (not shown) and a P-type ohmic contact layer (not shown) may be further included beneath the N-type and P-type bonding pads 50 and 55, respectively. Further, a transparent electrode layer (not shown) may be further included between the P-type semiconductor layer 13 and the P-type bonding pad 55.

The N-type and P-type bonding pads are pads for use in bonding the light emitting cell 1000 to an electrode layer through a metal bump or in electrically connecting the light emitting cell 1000 through an additional metal wire, and may be formed to have a laminated structure of Ti/Au. Further, the aforementioned transparent electrode layer is formed on an entire surface of the P-type semiconductor layer 13 and functions to uniformly transmit a voltage input through the P-type boding pad to the P-type semiconductor layer 13.

As described above, the unit light emitting cell 1000 of the present invention refers to a horizontal type light emitting cell formed on the sapphire substrate 10, and a diode block of the rectifying bridge or a light emitting cell block may be formed using a plurality of light emitting cells in the present invention.

Figure 8:
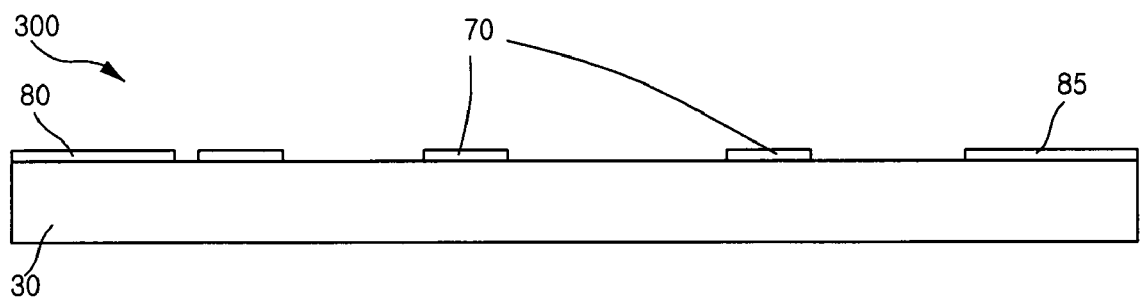
Figure 9:
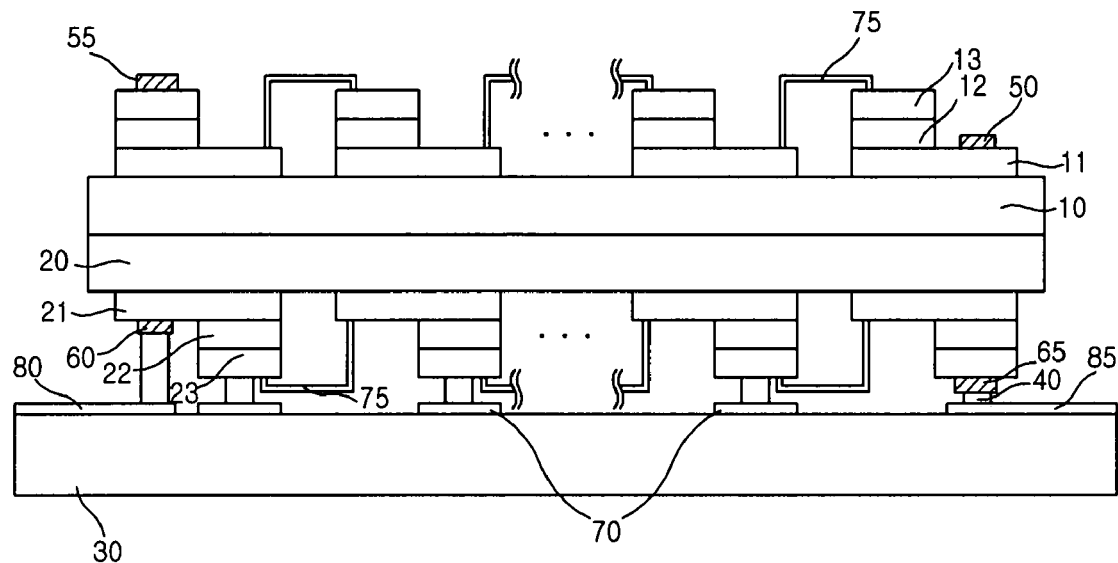
Figure 10:
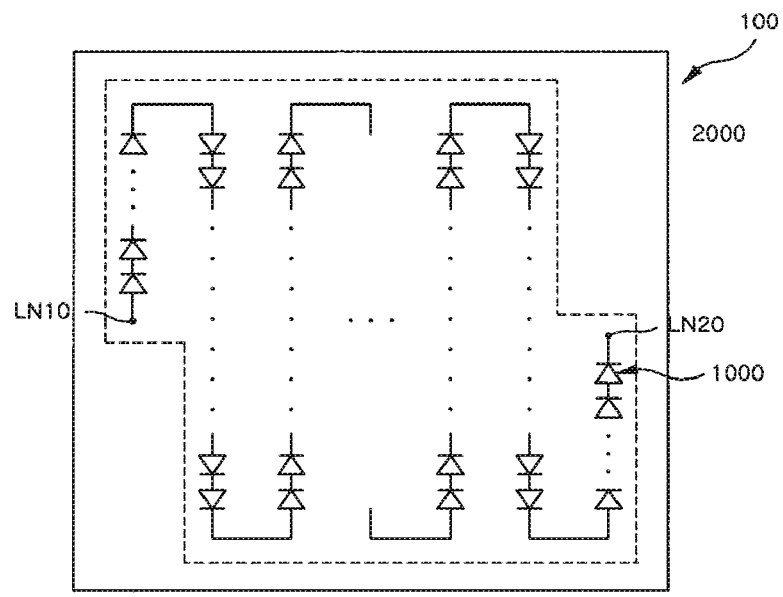
FIG. 10 is a conceptual diagram of a light emitting cell block formed on a first semiconductor substrate.
Figure 11:
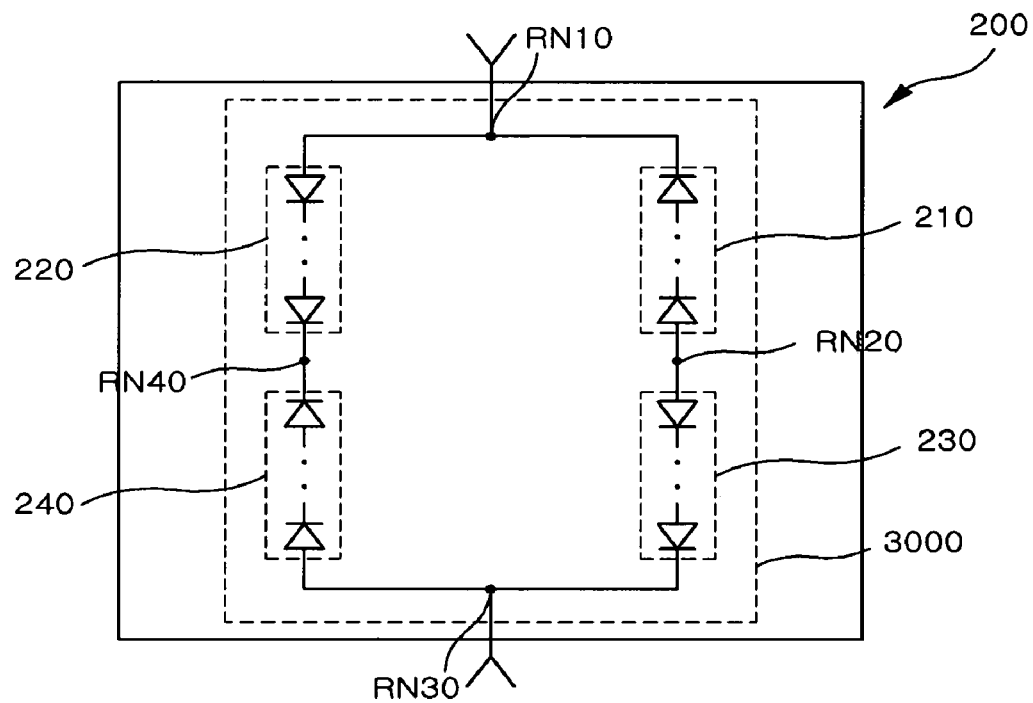
FIG. 11 is a conceptual diagram of a rectifying bridge formed on a second semiconductor substrate.
Figure 12:
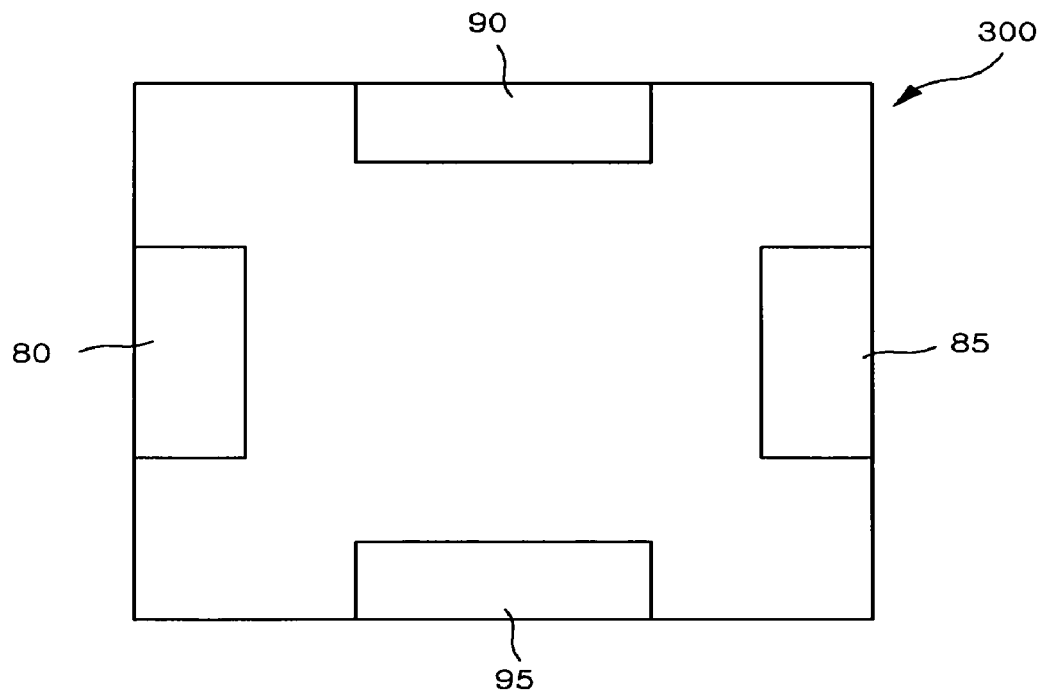
FIG. 12 is a schematic view showing power supply pads and connection pads formed on a submount substrate.

FIGS. 4 to 9 are sectional views illustrating a manufacturing process according to an embodiment of the present invention, FIG. 10 is a conceptual diagram of a light emitting cell block formed on a first semiconductor substrate, FIG. 11 is a conceptual diagram of the rectifying bridge formed on a second semiconductor substrate, and FIG. 12 is a schematic view showing power supply pads and connection pads formed on a submount substrate.

As shown in FIG. 10, a first semiconductor substrate 100 having a light emitting cell block 2000 formed thereon is first fabricated. The light emitting cell block 2000 is formed such that a plurality of light emitting cells 1000 are connected in series between first and second light emitting nodes LN10 and LN20.

A method of fabricating the first semiconductor substrate 100 will be briefly described below.

Figure 4:
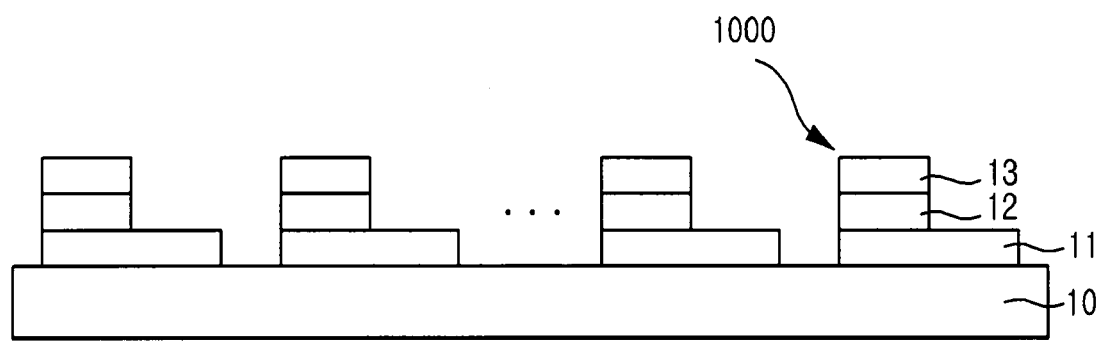
FIGS. 4 to 9 are sectional views illustrating a manufacturing process according to an embodiment of the present invention.

Referring to FIG. 4, the plurality of light emitting cells 1000 electrically isolated from one another are formed on a first substrate 10. To this end, light emitting layers, i.e., an N-type semiconductor layer 11, an active layer 12 and a P-type semiconductor layer 13 are first formed sequentially on the first substrate 10. The aforementioned material layers are formed through a variety of deposition and growth methods including metal organic chemical vapor deposition (MOCVD), chemical vapor deposition (CVD), plasma-enhanced chemical vapor deposition (PCVD), molecular beam epitaxy (MBE), hydride vapor phase epitaxy (HVPE), and the like.

Thereafter, the P-type semiconductor 13 and the active layer 12 are partially removed through a predetermined etching process so as to expose a portion of the N-type semiconductor layer 11. To form the plurality of light emitting cells 1000 on the substrate 10, a predetermined region of the exposed N-type semiconductor layer 11 is removed to expose the substrate 10. This process is not limited thereto but may be modified for the sake of convenience of the process. That is, portions of the P-type semiconductor layer 13, the active layer 12 and the N-type semiconductor layer 11 are first removed to expose a predetermined region of the substrate 10, and then predetermined portions of the P-type semiconductor layer 13 and the active layer 12 are then removed to expose a portion of the N-type semiconductor layer 11 so that the plurality of light emitting cells 1000 may be formed on the substrate 10. At this time, a dry or wet etching process may be performed, and a dry etching process using plasma is performed in this embodiment.

Figure 5:
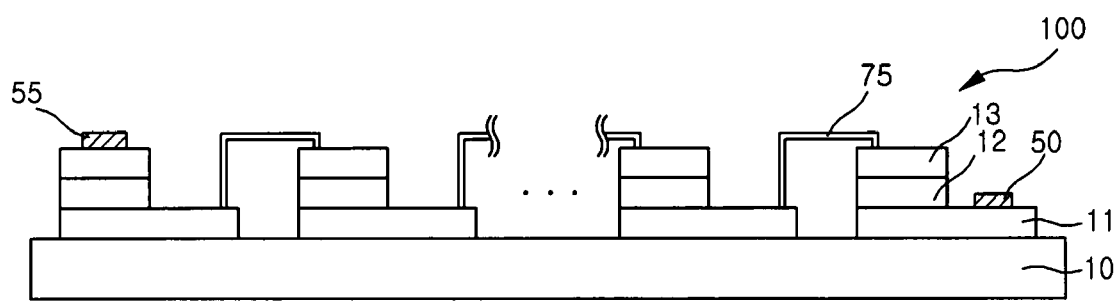

Referring to FIG. 5, the N-type and P-type semiconductor layers 11 and 13 between adjacent light emitting cells are connected through a wire forming process. That is, the exposed N-type semiconductor layer 11 of one light emitting cell and the P-type semiconductor layer 13 of another light emitting cell adjacent thereto are connected through a wire. At this time, a conductive wire 75 for use in making electrical connection between the N-type and P-type semiconductor layers 11 and 13 of the adjacent light emitting cells is formed through a process such as a bridge process or step coverage process.

The aforementioned bridge process is also referred to as an air-bridge process. In the air-bridge process, a photosensitive liquid is applied and developed through a photo process between chips to be connected to each other so as to form a photoresist pattern; a thin film is first formed on the photoresist pattern out of a material such as a metal or the like by means of a method such as deposition; and a gold-containing conductive material is applied again to a certain thickness on the thin film by means of a method such as electroplating, electroless plating or metal deposition. Thereafter, the photoresist pattern is removed using a solvent solution so that all the portions below the conductive material are removed and only the conductive material in the form of a bridge is formed in the air.

Further, in the step coverage process, a photosensitive liquid is applied and developed through a photo process between chips to be connected to each other such that portions to be connected to each other are left uncovered while the other portions are covered with a photoresist pattern, and a gold-containing conductive material is applied to a certain thickness on the photoresist pattern by means of a method such as electroplating, electroless plating or metal deposition. Subsequently, the photoresist pattern is removed using a solvent solution so that all the portions except the portions covered with the conductive material are removed and only the portions covered with the conductive material are left to function to electrically connect the chips to be connected to each other.

Any materials with conductivity as well as a metal may be used for the wire 75.

Further, for electrical connection through an additional wire, a P-type bonding pad 55 is formed on the P-type semiconductor layer 13 of the light emitting cell positioned at one edge of the substrate 10 and an N-type bonding pad 50 is formed on the N-type semiconductor layer 11 of the light emitting cell positioned at the other edge of the substrate 10.

In this embodiment, the number of the light emitting cells 1000 connected in series may greatly vary depending on a voltage/current for driving the single light emitting cell 1000 and an AC driving voltage applied to the light emitting device.

Next, a second semiconductor substrate 200 having a rectifying bridge 300 formed thereon is fabricated as shown in FIG. 11. The rectifying bridge 3000 comprises four diode blocks 210 to 240. The first and third diode blocks 210 and 230 are connected in series through a second rectifying node RN20, and the second and fourth diode blocks 220 and 240 are connected in series through a fourth rectifying node RN40. Further, the first and third diode blocks 210 and 230 connected in series and the second and fourth diode blocks 220 and 240 connected in series are connected in parallel through first and third rectifying nodes RN10 and RN30. Here, the first and third rectifying nodes RN10 and RN30 are connected to predetermined power supply pads for connection to an external AC power source.

At this time, each of the first to fourth diode blocks 210 to 240 comprises one or more diodes.

A method of fabricating the second semiconductor substrate 200 will be briefly described below.

Figure 6:
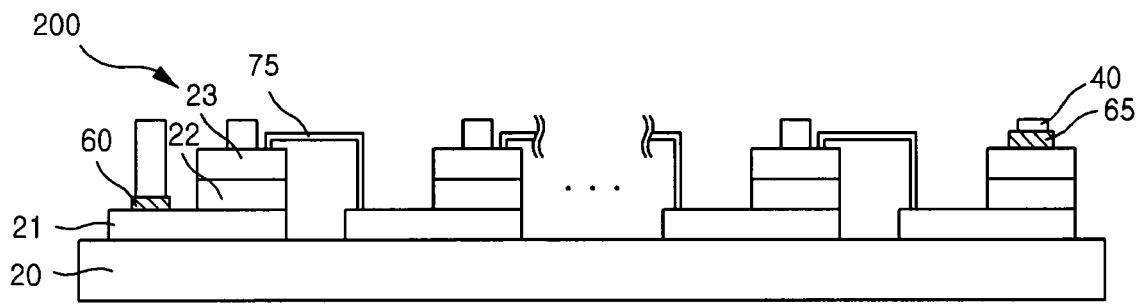

Referring to FIG. 6, the second semiconductor substrate 200 having a plurality of light emitting cells formed thereon is provided on a second substrate 20 in the same manner as the first semiconductor substrate 100. However, four diode blocks each of which comprises one or more diodes as described above are formed on the second semiconductor substrate 200. In this embodiment, light emitting cells are used for the diodes. That is, four diode blocks each of which comprises one or more light emitting cells are formed. N-type and P-type semiconductor layers 21 and 23 of adjacent light emitting cells within each of the diode blocks are connected through a predetermined wire forming process. For subsequent connection to electrodes through metal bumps, a P-type bonding pad 65 is formed on the P-type semiconductor layer 23 of the light emitting cell positioned at one edge of the substrate 20 and an N-type bonding pad 60 is formed on the N-type semiconductor layer 21 of the light emitting cell positioned at the other edge of the substrate 20. Further, the metal bumps 40 for bumping are formed on the P-type and N-type bonding pads 65 and 60 of each of the diode blocks and on the P-type semiconductor layer 23. The metal bumps 40 are made of at least one of Pb, Sn, Au, Ge, Cu, Bi, Cd, Zn, Ag, Ni and Ti.

The process of fabricating the first and second semiconductor substrates 100 and 200 of the present invention is not limited to the aforementioned method but may be variously modified, and a variety of material layers may be further added. That is, a buffer layer for reducing lattice mismatch between the substrate and subsequent layers may be further formed on the substrate. Further, a transparent electrode layer may be further formed between the P-type semiconductor layer and the P-type bonding pad. Furthermore, N-type and P-type ohmic contact layers may be formed beneath the N-type and P-type bonding pads, respectively.

Figure 7:
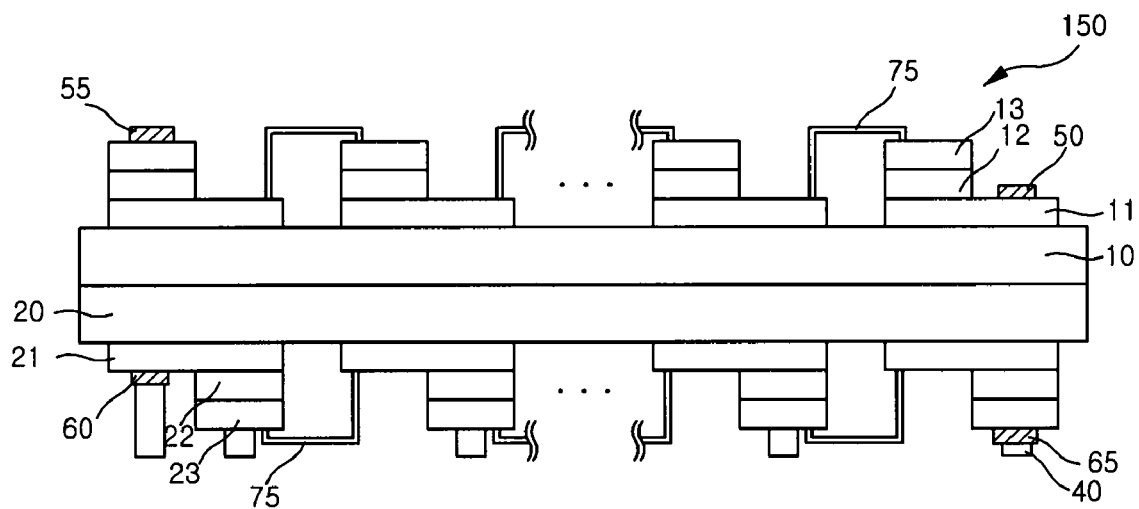

Thereafter, the first and second semiconductor substrates 100 and 200 are bonded to each other to form a light emitting substrate 150 as shown in FIG. 7. Rear surfaces of the first and second substrates 10 and 20 where the light emitting layers are not formed are bonded to be in contact with each other. To this end, the surfaces to be bonded are etched to a certain thickness, and the bonding is performed under only pressure or both pressure and heat applied at the normal temperature. The bonding of the two semiconductor substrates is preferably performed under vacuum and may be carried out through various bonding methods.

Accordingly, the light emitting substrate 150 respectively having the light emitting cell block 2000 and the rectifying bridge 3000 on both sides thereof is formed. That is, the light emitting substrate 150 comprises the light emitting cell block 2000 having the plurality of light emitting cells 1000 connected in series, and the rectifying bridge 3000 having the four diode blocks formed therein.

Next, a submount substrate 300 having power supply pads 90 and 95 and connection pads 80 and 85 formed thereon is fabricated as shown in FIG. 12.

Referring to FIG. 8, the submount substrate 300 comprises a plurality of bonding layers 70 formed on a substrate 30, a first connection pad 80 positioned at one edge of the substrate 30, and a second connection pad 85 positioned at the other edge thereof. FIG. 8 shows a view of a section including the connection pads 80 and 85, and the submount substrate further comprises the first and second power supply pads 90 and 95 formed separately from and spaced apart from the connection pads 80 and 85 as can be seen in FIG. 12.

At this time, various kinds of substrates 30 with superior thermal conductivity may be used as the substrate 30. That is, the substrate 300 is made of SiC, Si, Ge, SiGe, AlN, a metal, or the like. In this embodiment, AlN with superior thermal conductivity and an insulation property is used. It will be apparent that the present invention is not limited thereto but may employ a metallic material with high thermal conductivity and superior electrical conductivity. In this case, an insulation or dielectric film is formed on the substrate 30 so as to ensure sufficient insulation.

The power supply pads 90 and 95 and the connection pads 80 and 85 are made of a metal with superior electrical conductivity. These are formed by means of a screen printing method or a deposition process using a predetermined mask pattern. Further, the position and shape of each of the power supply pads 90 and 95 and the connection pads 80 and 85 are not limited to those shown in this figure but may be variously modified.

Thereafter, the light emitting substrate 150 and the submount substrate 300 are bonded to each other through the metal bumps 40 formed on the second semiconductor substrate 200 as shown in FIG. 9. At this time, the bonding may be performed using either heat or ultrasonic waves, or both heat and ultrasonic waves. The metal bumps 40 may be formed on the submount substrate 300 rather than the second semiconductor substrate 200.

Further, the light emitting cell block 2000 and the rectifying bridge 3000 respectively formed on the first and second semiconductor substrates 100 and 200 are electrically connected to each other.

Connection relationship between the light emitting substrate 150 and the submount substrate 300 upon bonding of them will be described below with reference to FIGS. 10 to 12.

As shown in FIG. 10, the light emitting cell block 2000 having the plurality of light emitting cells 1000 connected in series is formed between the first and second light emitting nodes LN10 and LN20 on the first semiconductor substrate 100. An anode of the light emitting cell block 2000 is connected to the first light emitting node LN10 and a cathode thereof is connected to the second light emitting node LN20. Further, the second semiconductor substrate 200 comprises four diode blocks 210 to 240 as shown in FIG. 11. The first and third diode blocks 210 and 230 allow a current to flow from the second rectifying node RN20 to the first and third rectifying nodes RN10 and RN30, respectively, and the second and fourth diode blocks 220 and 240 allow a current to flow from the first and third rectifying nodes RN10 and RN30 to the fourth rectifying node RN40, respectively. Here, the first and third rectifying nodes RN10 and RN30 are connected to an external AC power source, and the second and fourth rectifying nodes RN20 and RN40 are connected to the light emitting cell block 2000 of the first semiconductor substrate 100. Preferably, the light emitting node LN10 and the fourth rectifying node RN40 are connected to each other and the second light emitting node LN20 and the second rectifying node RN20 are connected to each other.

To this end, the N-type bonding pads 60 of the second and fourth diode blocks 220 and 240 formed on the second semiconductor substrate 200 are connected to the first connection pad 80 of the submount substrate 300 through the metal bumps 40, and the P-type bonding pads 65 of the first and third diode blocks 210 and 230 are connected to the second connection pad 85 of the submount substrate 300 through the metal bumps 40 as shown in FIG. 9. Further, the P-type bonding pad 55 of the light emitting cell block 2000 formed on the first semiconductor substrate 100 is connected to the first connection pad 80 of the submount substrate 300 through a predetermined wire (not shown), and the N-type bonding pad 50 of the light emitting cell block 2000 is connected to the second connection pad 85 of the submount substrate 300 through a predetermined wire (not shown). This shows a view of only a section including the connection pads 80 and 85. Likewise, the P-type bonding pad 65 of the second diode block 220 and the N-type bonding pad 60 of the first diode block 210, which are formed on the second semiconductor substrate 200, are connected to the first power supply pad 90 of the submount substrate 300 through the metal bumps 40, and the P-type bonding pad 65 of the fourth diode block 240 and the N-type bonding pad 60 of the third diode block 230 are connected to the second power supply pad 95 of the submount substrate 300 through the metal bumps 40.

Here, external AC power is applied through the first and second power supply pads 90 and 95 of the submount substrate 300, and a current rectified by the rectifying bridge 3000 of the second semiconductor substrate 200 is applied to the light emitting cell block 2000 of the first semiconductor substrate 100 through the first and second connection pads 80 and 85. Therefore, the light emitting cell block 2000 emits light by means of the rectifying bridge 3000 regardless of the phase of the external AC power.

The aforementioned method of manufacturing the light emitting device of the present invention is merely a specific embodiment and is not limited thereto. Various configurations and manufacturing methods may be made or added depending on the characteristics of a device and convenience of a process.

Accordingly, it is possible to manufacture a light emitting device which further comprises a first semiconductor substrate formed with a light emitting cell block to which a voltage is applied through the rectifying bridge on a structure in which a second semiconductor substrate having a rectifying bridge formed thereon is flip-chip bonded to the top of a submount substrate.

Such a light emitting device of the present invention can have advantages resulting from a flip-chip structure with enhanced light efficiency and heat dissipation, and at the same time, other advantages in that a flicker effect generated from an AC power source can be minimized by integrating a rectifying circuit into the device and constant brightness can be maintained even through the voltage of the AC power source is changed.

Figure 13:
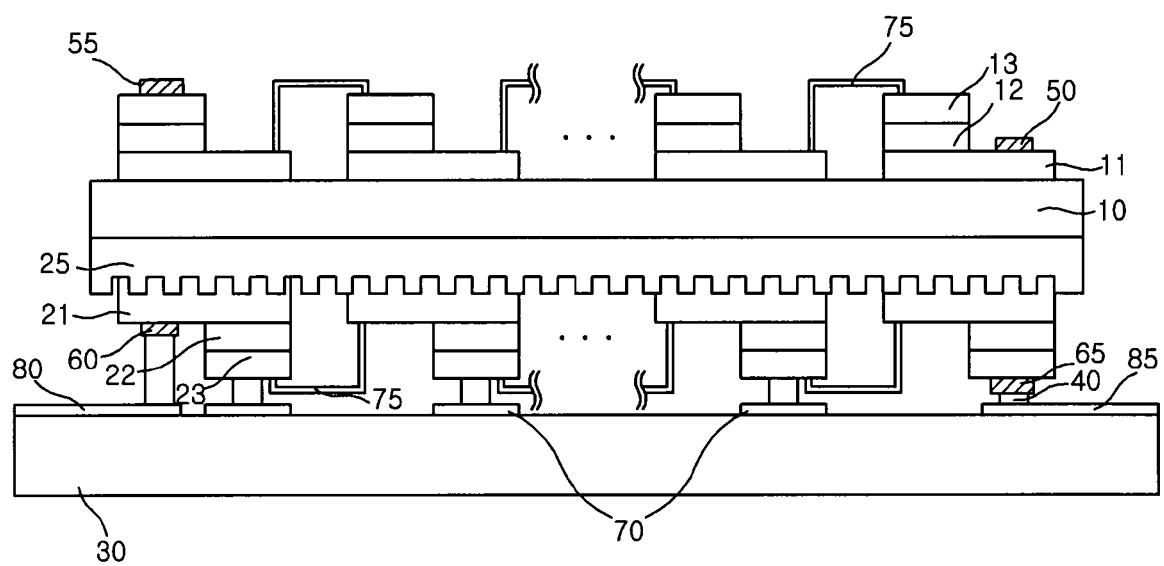
FIG. 13 is a sectional view showing a modification of the embodiment according to the present invention.

FIG. 13 shows a modification of the embodiment according to the present invention. A description overlapping with that of the aforementioned embodiment will be omitted herein.

Referring to this figure, a light emitting device comprises a second semiconductor substrate having a rectifying bridge formed on a second substrate 25 having uneven portion; a submount substrate to which the second semiconductor substrate is flip-chip bonded; and a first semiconductor substrate bonded to a rear surface of the second substrate 25 and formed with a light emitting cell block having a plurality of light emitting cells connected in series.

This can be manufactured by first forming uneven portion with certain shapes on the second substrate 25 through a predetermined etching process and performing the same manufacturing process as described above.

Since photons that may be reflected on a conventional flat surface are not reflected on surfaces at various angles but emitted to the outside due to the uneven portion in this embodiment, there is an advantage in that high luminance and light emitting efficiency can be obtained.

Although this figure shows that the uneven portion are formed on the second substrate, the present invention is not limited thereto. The uneven portion may be formed on the first substrate to increase the possibility that light produced from a light emitting layer will be emitted to the outside the light emitting device, thereby obtaining further higher luminance and superior light output characteristics.

The light emitting device and the method of manufacturing the same according to the present invention have advantages in that a flicker effect generated from an AC power source can be minimized and constant brightness can be maintained even in changes in the voltage of the AC power source by integrating a rectifying circuit into a light emitting device with a flip-chip structure. Further, since the rectifying circuit is formed within the device, there are advantages in that there is no cumbersomeness of mounting an additional auxiliary device, resulting in increase of the degree of utilization of space and improved light output.

The invention claimed is:

1. A light emitting device, comprising:
   a first semiconductor substrate including a light emitting cell block having a plurality of light emitting cells connected in series on one surface thereof;
   a second semiconductor substrate having one surface formed with a rectifying bridge and the other surface bonded to the other surface of the first semiconductor substrate; and
   a submount substrate to which the second semiconductor substrate is flip-chip bonded to be in contact with the one surface of the second semiconductor substrate,
   wherein rectified power is applied to the light emitting cell block through the rectifying bridge.

2. The light emitting device as claimed in claim 1, wherein the rectifying bridge comprises:
   a first diode block connected between first and second nodes;
   a second diode block connected between the first node and a fourth node;

a third diode block connected between the second node and a third node; and a fourth diode block connected between the third and fourth nodes.

3. The light emitting device as claimed in claim 2, wherein the light emitting cell block is connected between the second and fourth nodes, and a power source is connected between the first and third nodes.

4. The light emitting device as claimed in claim 2, wherein the submount substrate comprises first and second connection pads and first and second power supply pads, the connection and the power supply pads being formed to be spaced apart form one another, and the first power supply pad is connected between the first and second diode blocks, the second power supply pad is connected between the third and fourth diode blocks, the first connection pad is connected between the first and third diode blocks, the second connection pad is connected between the second and fourth diode blocks, and both ends of the light emitting cell block are respectively connected to the first and second connection pads.

5. The light emitting device as claimed in claim 1, wherein each of the plurality of light emitting cells of the light emitting cell block comprises N-type and P-type semiconductor layers, and the N-type and P-type semiconductor layers of adjacent light emitting cells are electrically connected, an N-type bonding pad is formed on the N-type semiconductor layer of the light emitting cell at one end of the light emitting cell block, and a P-type bonding pad is formed on the P-type semiconductor layer of the light emitting cell at the other end of the light emitting cell block.

6. The light emitting device as claimed in claim 1, wherein uneven portion are formed on at least one surface of the first or second semiconductor substrate.

7. A method of manufacturing a light emitting device, comprising the steps of:

providing a first semiconductor substrate by forming a light emitting cell block having a plurality of light emitting cells connected in series on one surface of a first substrate;

providing a second semiconductor substrate by forming a rectifying bridge on one surface of a second substrate;

bonding the first and second substrates such that the other surfaces of the first and second substrates are in contact with each other; and bonding the second substrate to a submount substrate such that the rectifying bridge of the second semiconductor substrate is connected thereto, and connecting the light emitting cell block to the rectifying bridge.

8. The method as claimed in claim 7, wherein the step of providing the first semiconductor substrate comprises the steps of:

sequentially forming N-type and P-type semiconductor layers on the one surface of the first substrate;

partially removing the N-type and P-type semiconductor layers to form a plurality of light emitting cells; and connecting the N-type semiconductor layer of one light emitting cell to the P-type semiconductor of another light emitting cell adjacent thereto through a bridge wire.

9. The method as claimed in claim 7, wherein the step of providing the second semiconductor substrate comprises the step of forming four diode blocks each of which has one or more light emitting cells on the one surface of the second substrate.

10. The method as claimed in claim 9, wherein the step of forming the diode blocks comprises the steps of:

forming a plurality of light emitting cells on the one surface of the second substrate;

connecting the N-type semiconductor layer of one light emitting cell and the P-type semiconductor of another light emitting cell adjacent thereto through a bridge wire; and forming an N-type bonding pad on the N-type semiconductor layer of the light emitting cell at one end of the diode block, and forming a P-type bonding pad on the P-type semiconductor layer of the light emitting cell at the other end of the diode block.

11. The method as claimed in claim 8, wherein the bridge wire connects the N-type semiconductor layer of one light emitting cell to the P-type semiconductor layer of the other light emitting cell adjacent thereto through a bridge process or a step coverage process.

12. The method as claimed in claim 7, further comprising the step of forming uneven portion on the one surface of the first substrate before the step of providing the first semiconductor substrate.

* * * * *